United States Patent [19]
Takeyama

[11] Patent Number: 5,467,023
[45] Date of Patent: Nov. 14, 1995

[54] CONNECTOR INSPECTING APPARATUS HAVING SIZE REGULATING MEMBER FOR RETAINER TEST FITTING PROBES EXTERNAL TO THE CONNETOR FOR RETAINER INTEGRITY DETECTION

[75] Inventor: Jun Takeyama, Yokkaichi, Japan

[73] Assignee: Sumitomo Wiring Systems, Ltd., Mie, Japan

[21] Appl. No.: 294,728

[22] Filed: Aug. 22, 1994

[30] Foreign Application Priority Data

Aug. 24, 1993 [JP] Japan .................................. 5-046059

[51] Int. Cl.⁶ .......................... G01R 1/04; G01R 31/04
[52] U.S. Cl. .................. 324/754; 324/72.5; 439/310; 29/593
[58] Field of Search .................. 439/310; 324/754, 324/761, 65, 51, 72.5, 73 R; 29/593, 597

[56] References Cited

U.S. PATENT DOCUMENTS

| | | | |
|---|---|---|---|
| 4,232,262 | 11/1980 | Emo et al. | 324/65 |
| 4,658,212 | 4/1987 | Ozawa et al. | 324/72.5 |
| 4,902,968 | 2/1990 | Sugimoto | 324/538 |
| 5,335,413 | 8/1994 | Yamamoto et al. | 29/593 |

Primary Examiner—Kenneth A. Wieder
Assistant Examiner—Barry C. Bowser
Attorney, Agent, or Firm—Beveridge, DeGrandi, Weilacher & Young

[57] ABSTRACT

The present invention provides a connector inspecting apparatus (D1, D2, D3, D4) for inspecting a connector having a retainer (R1, R2, R3, R4) for positioning and fixing a plurality of terminal metal fittings to predetermined positions in a housing (H1, H2, H3, H4). A receiving portion (40) for receiving the housing (H1, H2, H3, H4) of the connector (C1, C2, C3, C4) has a size regulating member (60) adapted to come in contact with the retainer (R1, R2, R3, R4) for positioning the housing (H1, H2, H3, H4) at the time of inspection.

8 Claims, 7 Drawing Sheets

1

CONNECTOR INSPECTING APPARATUS HAVING SIZE REGULATING MEMBER FOR RETAINER TEST FITTING PROBES EXTERNAL TO THE CONNETOR FOR RETAINER INTEGRITY DETECTION

TECHNICAL FIELD OF THE INVENTION

The present invention relates to a connector inspecting apparatus, and more particularly to a connector inspecting apparatus for inspecting the electrical conduction of terminal metal fittings of a connector which has a retainer and which is used in an important circuit of a motor vehicle.

RELATED BACKGROUND ART

Generally, a connector includes a housing and terminal metal fittings housed therein, and is used for wiring an electrical article such as a wire harness or the like.

Conventionally, there have been proposed various types of connectors so arranged as to prevent the terminal metal fittings from slipping off from the insides of the housings. For example, a motor vehicle employs, in an important circuit thereof, a connector having a retainer. In such a connector, after terminal metal fittings are inserted into a housing, a retainer is pushed inside of the housing from a predetermined direction such that the terminal metal fittings are positioned and fixed at predetermined positions.

The retainer for preventing the terminal metal fittings from slipping off, is small as compared with the housing. This involves the likelihood that, when assembling such a connector, the operator fails to mount a retainer or overlooks that the retainer has been defectively pushed in. In such a case, the primary object of the retainer cannot be achieved.

In this connection, a conventional connector inspecting apparatus as disclosed in U.S. Pat. No. 4,902,968 for example, is arranged as set forth below. At the final step of producing an electrical article such as a wire harness or the like, not only the attachment of terminal metal fittings and the crimping of electric wires are checked for quality, but also the attachment of a retainer is checked for quality. FIGS. 1 and 2 show the most typical example of prior arts disclosed in U.S. Pat. No. 4,902,968 above-mentioned.

FIG. 1 is a perspective view illustrating the arrangement of a connector inspecting apparatus of the prior art. FIG. 2 is a plan view, with portions crossed, illustrating the arrangement of the apparatus in FIG. 1.

Referring to FIG. 1, a connector inspecting apparatus D includes a detecting unit 4 for detecting the defective attachment of a retainer. The detecting unit 4 is arranged to detect, at the time of inspection of a connector C, the defective attachment of a retainer R, if any, such that a lock lever 43 mechanically prevents the movement of a conduction inspecting unit 2. More specifically, if the retainer R has not perfectly been inserted in the housing H, the retainer R transversely projects with respect to the housing H. When the connector C is inserted into a receiving portion 1 with the retainer R transversely projecting, a detecting pin 41 retreats to push an edge piece 42. This causes the lock lever 43 to be rotated in a direction of an arrow A1 in FIG. 2. This results in the engagement of the lock lever 43 with an arm receiver 44. Accordingly, a cam lever 3 cannot be raised to prevent the conduction inspecting unit 2 from being moved to the receiving portion 1. This indicates that the attachment of the retainer R is defective.

On the other hand, when the retainer R has perfectly been mounted on the housing H, the housing H and the retainer R are substantially flush with each other. Accordingly, the connector C can smoothly be inserted into the receiving portion 1. The cam lever 3 can therefore be raised such that detecting pieces 21 of the conduction inspecting unit 2 come in contact with terminal metal fittings (not shown) of the connector C, thus providing an electrical connection therebetween. Thus, the connector C can be inspected for electrical conduction and it is made sure that the retainer R has perfectly been mounted. If the terminal metal fittings have not been inserted into the housing H or if electric wires have defectively been crimped on the terminal metal fittings, no electrical conduction is provided.

The connector inspecting apparatus of the prior art represented by that shown in FIGS. 1 and 2, is useful to a certain extent in that the defective attachment of a retainer can also be inspected.

However, the connector inspecting apparatus above-mentioned additionally has the detecting unit for detecting the defective attachment of a retainer, and is arranged such that, when the detecting unit detects the defective attachment of a retainer, the movement of the main connector conduction inspecting unit is mechanically prevented. Thus, the apparatus is complicated in structure. In this connection, the apparatus is disadvantageously made in a large size. Further, the apparatus is arranged such that the lock lever 43 is engaged with the arm receiver 44 at the time only when the retainer R projects from the connector C. Accordingly, the apparatus cannot detect the fact that no retainer has been mounted.

DISCLOSURE OF THE INVENTION

In view of the technical problems above-mentioned, the present invention is proposed with the object of providing a simple small-size connector inspecting apparatus capable of detecting a failure to mount a retainer.

As a first aspect, the present invention provides a connector inspecting apparatus which is used for inspecting a connector having a retainer for fixing, in an assistant manner, terminal metal fittings mounted on a housing at predetermined positions thereof and which comprises: an inspecting portion having detecting pieces which are disposed as corresponding to the terminal metal fittings of a connector to be inspected and which are adapted to be electrically connected to the terminal metal fittings when the detecting pieces are brought into contact therewith by a predetermined contact pressure; a receiving portion adapted to receive the housing such that the terminal metal fittings are opposite to the detecting pieces and that the housing is movable toward and away from the detecting pieces; means for moving the inspecting portion to a predetermined position in close proximity to the connector held in the receiving portion and also for returning the inspecting portion from the proximate position to the original position; and a size regulating member integrally formed at the receiving portion for positioning, at the time of inspection, the housing through the retainer of the connector.

According to the connector inspecting apparatus having the arrangement above-mentioned, the connector is inspected by bringing the inspecting portion near to the connector receiving portion after the connector has been fitted therein. At this time, when the retainer has been mounted on the housing, the retainer comes in contact with the size regulating member to position the housing in the receiving portion. This causes the detecting pieces to be pressed against the terminal metal fittings in the housing, resulting in an electrical connection therebetween. This achieves the inspection of the terminal metal fittings for their attachment state.

On the other hand, if the retainer has not been mounted on the housing, there is formed a slight gap between the housing and the size regulating member. Accordingly, a predetermined contact pressure is not applied to the detecting pieces to prevent the same from being electrically conducted. This detects the fact that the retainer has not been mounted on the housing.

As another aspect, the present invention provides a connector inspecting apparatus which is used for inspecting a connector having a retainer for fixing, in an assistant manner, terminal metal fittings mounted on a housing at predetermined positions thereof and which comprises: an inspecting portion having detecting pieces which are disposed as corresponding to the terminal metal fittings of a connector to be inspected and which project toward a receiving portion such that the detecting pieces are adapted to come in contact with and electrically connect to the terminal metal fittings, and pushing pieces projecting and biased toward the receiving portion such that the pushing pieces are adapted to come in contact with and then push the end surface of the housing before the detecting pieces come in contact with the terminal metal fittings; the receiving portion adapted to receive the housing such that the terminal metal fittings are opposite to the detecting pieces and that the housing is movable toward and away from the detecting pieces; means for moving the inspecting portion to a predetermined position in close proximity to the connector held in the receiving portion and also for returning the inspecting portion from the proximate position to the original position; and a size regulating member integrally formed at the receiving portion for positioning, through the retainer of the connector, the housing with respect to the inspecting portion located in the proximate position.

According to the connector inspecting apparatus having the arrangement above-mentioned, the retainer comes in contact with the size regulating member to position the housing in the receiving portion when the retainer has been mounted on the housing. Accordingly, when the inspecting portion is brought near to the receiving portion at the time of inspection, the pushing pieces first come in contact with the end surface of the housing. However, the retainer comes in contact with the size regulating member to regulate the movement of the connector. Accordingly, when the inspecting portion reaches the predetermiend position in close proximity to the receiving portion, the detecting pieces come in contact with the terminal metal fittings in the housing. This results in an electrical connection between the detecting pieces and the terminal metal fittings.

On the other hand, when the retainer has not been mounted on the housing, there is formed a slight gap between the housing and the size regulating member. At the time of inspection, the housing is positionally shifted as pushed by the pushing pieces. Accordingly, as brought into contact with the size regulating member, the housing is positioned in the receiving portion. Therefore, when the inspecting portion reaches the predetermined position in close proximity to the receiving portion, the detecting pieces do not come in contact with the terminal metal fittings in the housing. As a result, the detecting pieces are not electrically connected to the terminal metal fittings. Thus, it is detected that the retainer has not been mounted on the housing.

As discussed in the foregoing, the present invention is arranged such that, at the time of connector inspection, when the inspecting portion is brought near to the connector receiving portion having the size regulating member, it is detected whether or not the retainer has been mounted on the housing, based on the fact whether or not in the receiving portion the retainer comes in contact with the size regulating member to cause the detecting pieces to be electrically conducted. Accordingly, a conventional conduction inspecting mechanism can be utilized, as it is, for checking whether or not the retainer has been mounted. Therefore, even though a function of checking a failure to mount a retainer is added to the inspecting apparatus, the apparatus is advantageously simple in structure and made in a compact design.

BRIEF DESCRIPTION OF THE DRAWINGS

By way of example, only specific embodiments of the present invention will now be described with reference to the accompanying drawings, in which.

DESCRIPTION OF THE PREFERRED EMBODIMENTS

The following description will discuss a first embodiment of the present invention with reference to FIGS. 3 to 6.

Figure 1:
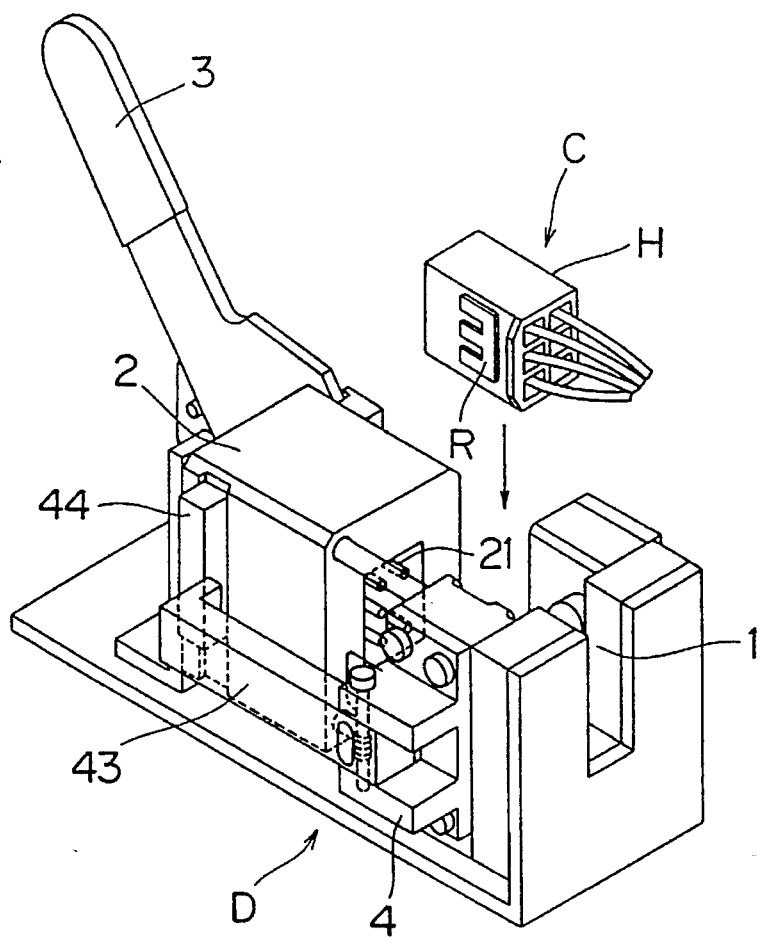
FIG. 1 is a perspective view illustrating the arrangement of a connector inspecting apparatus of prior art.
Figure 2:
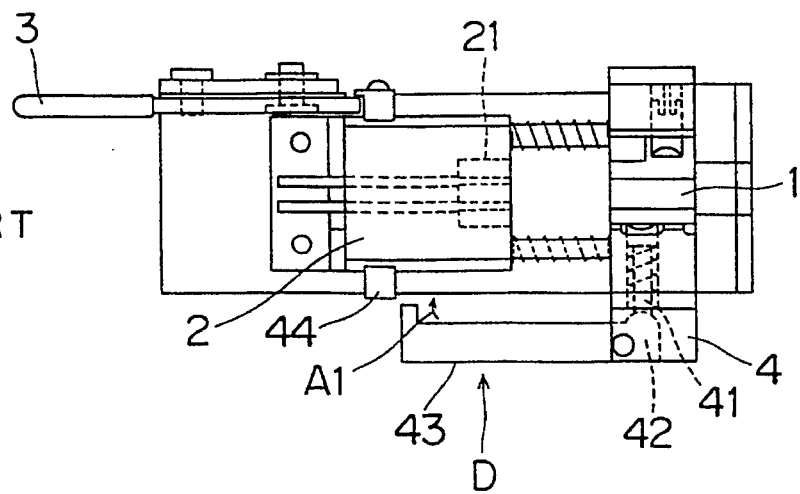
FIG. 2 is a plan view, with portions crossed, of the connector inspecting apparatus of the prior art.
Figure 3:
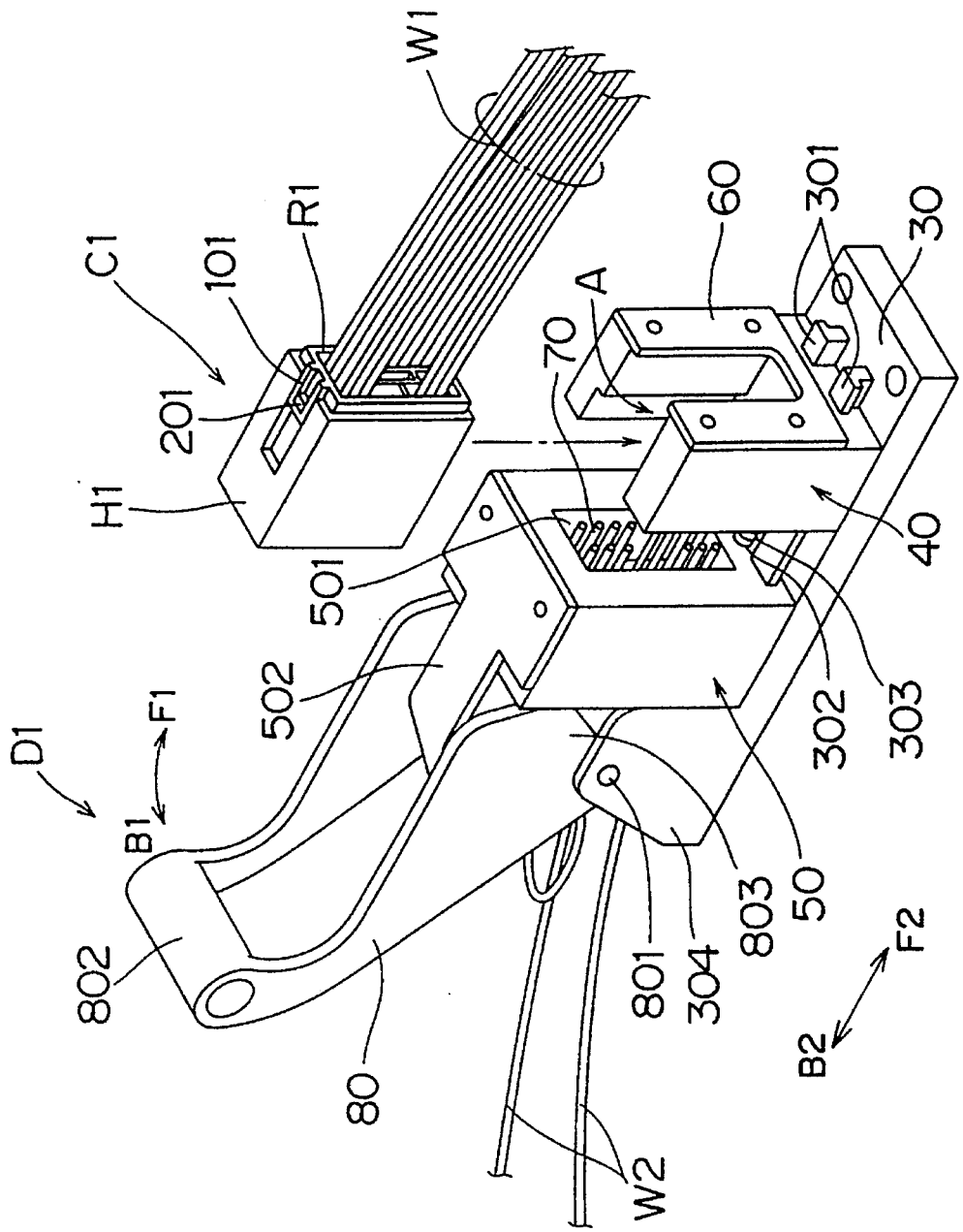
FIG. 3 is a perspective view illustrating the arrangement of a connector inspecting apparatus according to a first embodiment of the present invention.

FIG. 3 is a perspective view illustrating the arrangement of a connector inspecting apparatus D1 according to the first embodiment of the present invention. In FIG. 3, the connector inspecting apparatus D1 is used for inspecting, for example, a connector C1 attached to a wire harness. The wire harness is placed on an inspection drawing plate (not shown) on which the connection diagram of electric wires has been previously drawn, so that the connector C1 is to be inspected.

The connector C1 to be inspected by the connector inspecting apparatus D1, is for example a connector used in an important circuit in a motor vehicle, and has a retainer R1. The connector C1 is formed in the following manner. According to a so-called housing lance method, terminal metal fittings T (See FIGS. 5 and 6) crimped on ends of electric wires W1 are fitted in a housing H1 and the retainer R1 having a predetermined configuration is pushed into the housing H1 from the rear side. An engagement piece 101 formed at the rear of the outer wall of the retainer R1, is engaged with a locking pawl 201 projecting from the housing H1, causing the retainer R1 to be set. When the retainer R1 is set in the housing H1, the rear end of the retainer R1 slightly projects from the rear end of the housing H1.

The connector inspecting apparatus D1 has a base 30 to be fixed onto the inspection drawing plate with screws or the like. The base 30 has a rectangular shape extending back and forth, and is provided on the top thereof with a pair of slide rails 301 extending longitudinally on the base 30. A receiving portion 40 and an inspecting portion 50 are fitted in the slide rails 301.

The receiving portion 40 is disposed for holding the connector C1 to be inspected. The receiving portion 40 is fixed to the front end of the base 30 from the underside thereof with screws or the like. The receiving portion 40 has a substantially channel like cross-section along a direction at a right angle to the slide rails 301, and has a housing space A in which the connector C1 to be inspected is housed. The housing space A is formed penetrating through the front and rear walls of the receiving portion 40 such that the tip portion of the housing H1 projects by a predetermined amount toward the inspecting portion 50 and that the electric wires W1 extending from the housing H1 pass through the housing space A. The housing space A has such an inner configuration that the housing H1 is movable back and forth. A size regulating member 60 substantially in a U-shape is attached to the front surface of the receiving portion 40 with screws or the like. When inspecting the connector C1 inserted in the housing space A of the receiving portion 40, the size regulating member 60 comes in contact with the retainer R1 for positioning the rear side of the housing H1 (at the side to which the electric wires W1 are connected).

The inspecting portion 50 is disposed for inspecting an electrical conduction of the connector C1 held by the receiving portion 40. The inspecting portion 50 is movable back and forth along the slide rails 301. A guide bar 302 is inserted in the inspecting portion 50 and extends between and in parallel with the slide rails 301. With one end of the guide bar 302 fixed to one of the receiving portion 40 and the inspecting portion 50, the other end of the guide bar 302 passes through the other of the receiving portion 40 and the inspecting portion 50 such that the other of the receiving portion 40 and the inspecting portion 50 is relatively movable. A coiled spring 303 is disposed on the guide bar 302 between the inspecting portion 50 and the receiving portion 40 for returning the inspecting portion 50 to the original position. Thus, the inspecting portion 50 is normally biased rearward by the coiled spring 303.

The inspecting portion 50 is substantially rectangular and is provided in the front side thereof with a window 501. This window 501 has a configuration corresponding to the tip portion of the housing H1, and has an opening area such that the tip portion of the housing H1 can be inserted into the opening. Arranged in the window 501 are a plurality of detecting pieces 70 corresponding to the terminal metal fittings T of the connector C1. The detecting pieces 70 have heads which project toward the connector receiving portion 40 and which are resiliently biased thereto. An upper guide 502 for guiding a lever 80, to be discussed later, is attached to the top of the inspecting portion 50 with screws or the like.

A pair of lever attaching pieces 304 stand from the rear end of the base 30. The lever 80 is attached to the lever attaching pieces 304 such that the lever 80 is rotatable around an axis 801 at a right angle to the slide rails 301. The lever 80 is adapted to move the inspecting portion 50 to a predetermined position in close proximity to the connector C1 to be inspected as held by the receiving portion 40 and also to return the inspecting portion 50 from the proximate position to the original position away from the receiving portion 40. The lever 80 is provided at an upper portion thereof with an operating handle 802 for rotatingly operating the lever 80. The lever 80 is provided at a lower portion thereof with cams 803 projecting toward the inspecting portion 50. The cams 803 are integral with the lever 80 and come in contact with the rear surface of the inspecting portion 50.

With the arrangement above-mentioned, when the lever 80 is raised as pulled forward (in the direction of an arrow F1) with the operating handle 802 grasped, the cams 803 push the inspecting portion 50. This causes the inspecting portion 50 to be slided forward (in the direction of an arrow F2) along the slide rails 301 against the biasing force of the coiled spring 303. When the lever 80 is rotated until it stands substantially vertically, the inspecting portion 50 comes in contact with the connector receiving portion 40. When the lever 80 is fully returned rearward (in the direction of an arrow B1), the inspecting portion 50 is slided rearward (in the direction of an arrow B2) by the biasing force of the coiled spring 303, causing the inspecting portion 50 to be returned to the original position.

Figure 4:
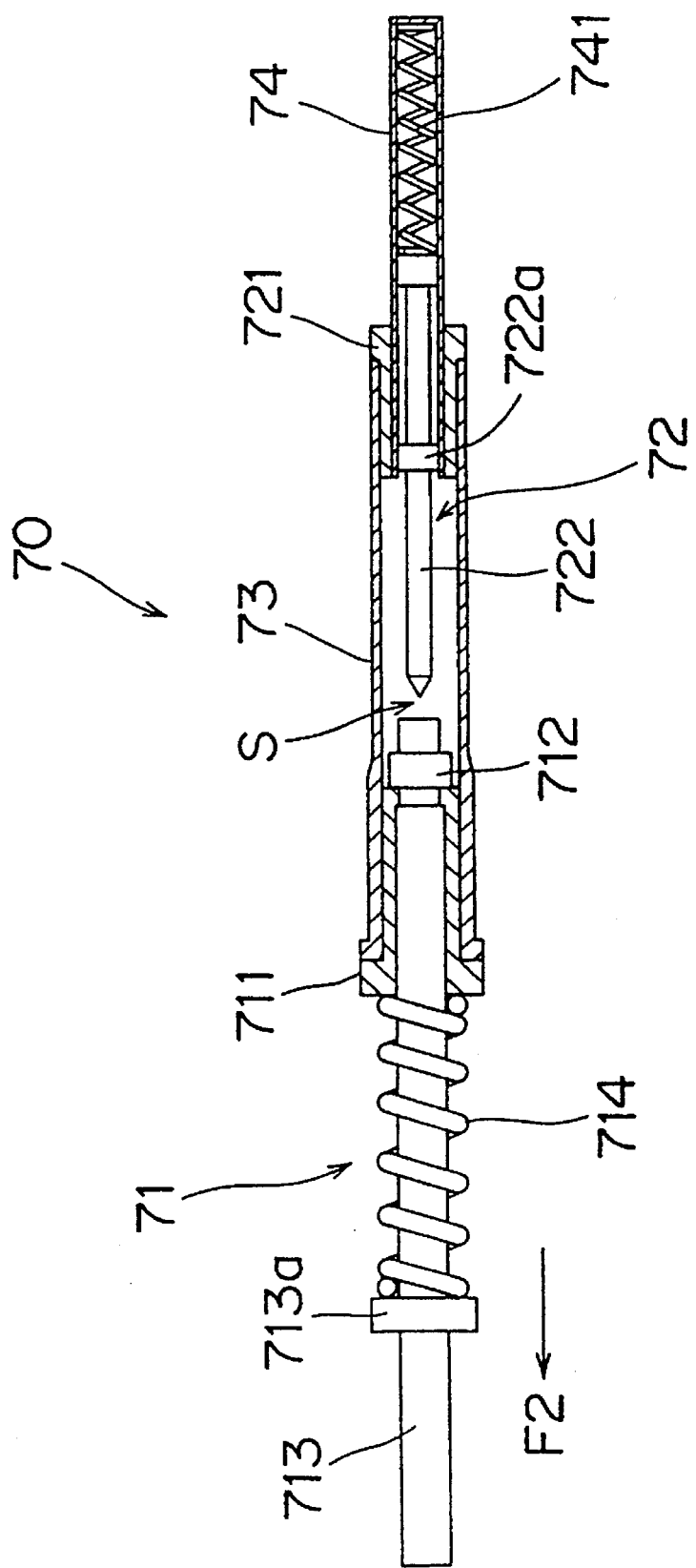
FIG. 4 is a section view illustrating the arrangement of a detecting piece.

FIG. 4 is a section view illustrating the arrangement of a detecting piece. Referring to FIG. 4, the detecting piece 70 has a sleeve 73 inserted in the inspecting portion 50, and two probes 71, 72 connected in series to each other. More specifically, the detecting piece 70 is of a so-called two-probe type having a first probe 71 which is opposite to the connector receiving portion 40 and which is adapted to come in contact with a terminal metal fitting T of the connector C1, and a second probe 72 connected in series to the first probe 71 at the rear side thereof.

The first probe 71 is provided at the tip thereof with a head 713 adapted to come in contact with a terminal metal fitting T of the connector C1. A coiled spring 714 is put on the first probe 71 from the rear side thereof such that the coiled spring 714 comes in contact with a flange 713a of the head 713. A boss 711 is slidably fitted to the first probe 71 at the rear of the coiled spring 714. A stopper 712 for preventing the boss 711 from slipping off, is attached to that rear end of the first probe 71 projecting from the boss 711. The boss 711 is inserted in a tip of a sleeve 73 (facing to the connector receiving portion 40). Accordingly, the first probe 71 is normally biased toward the connector receiving portion 40 (in the direction of the arrow F2) by the coiled spring 714.

The second probe 72 is provided at the tip thereof with a head 722 adapted to come in contact with the rear end of the first probe 71. The second probe 72 is slidably inserted into a slender sleeve 74 in which a coiled spring 741 is housed at the tip thereof. The tip portion of the slender sleeve 74 is inserted into a boss 721. The boss 721 is fitted to the rear end of the sleeve 73. Accordingly, the second probe 72 is normally biased toward the first probe 71 by the coiled spring 741. When the second probe 72 is slided, a flange 722a of the head 722 comes in sliding contact with the inner wall of the slender sleeve 74.

When the stopper 712 of the first probe 71 comes in contact with the rear end of the boss 711, a gap S is formed between the first probe 71 and the second probe 72.

The coiled spring 714 is formed such that, when the first probe 71 comes in contact with a terminal metal fitting of a connector C1 having the retainer R1, the coiled spring 714 is compressed to allow the first probe 71 and the second probe 72 to be short-circuited, and that, when the first probe 71 comes in contact with a terminal metal fitting of a connector C1 having no retainer R1, the coiled spring 714 enables the connector C1 to be pushed to the size regulating member 60 with the gap S maintained.

With the arrangement above-mentioned, when a connector C1 to be inspected is put in the receiving portion 40 and the lever 80 is raised to move the inspecting portion 50 toward the connector receiving portion 40, the terminal metal fittings T in the housing H1 first come in contact with the heads 713 of the first probes 71. When the inspecting portion 50 is further slid, the coiled springs 714 are compressed such that the gaps S between the first probes 71 and the second probes 72 are ultimately eliminated. As a result, the rear ends of the first probes 71 come in contact with the heads 722 of the second probes 72. When the coiled springs 714 are further compressed, the contact pressure provided thereby causes the terminal metal fittings T and the first probes 71 to be electrically connected to each other, and the contact pressure provided by the coiled springs 741 causes the first probes 71 and the second probes 72 to be electrically connected to each other.

Accordingly, when the terminals of lead wires W2 (See FIG. 3) connected to an inspecting unit (not shown) have been connected to the slender sleeves 74, it can be detected that there is formed a circuit from the terminal metal fittings T →the first probes 71→the second probes 72 to the slender sleeves 74.

For inspecting the connector C1, the connector C1 is fitted in the housing space A of the receiving portion 40 such that the electric wires W1 crimped on the terminal metal fittings T extend in the forward direction F2, as shown in FIG. 3. After the connector C1 has been mounted on the receiving portion 40, the inspection operator raises the lever 80 in the forward direction F1. As the lever 80 is raised, the inspecting portion 50 is moved toward the connector receiving portion 40 in the forward direction F2 and the housing H1 enters the window 501 of the inspecting portion 50. Then, the detecting pieces 70 come in contact with the tips of the terminal metal fittings T of the connector C1. When the lever 80 is further raised from the state above-mentioned and rotated to a position where the lever 80 stands substantially vertically, the opposite end surfaces of the inspecting portion 50 and the receiving portion 40 come in contact with each other.

Figure 5:
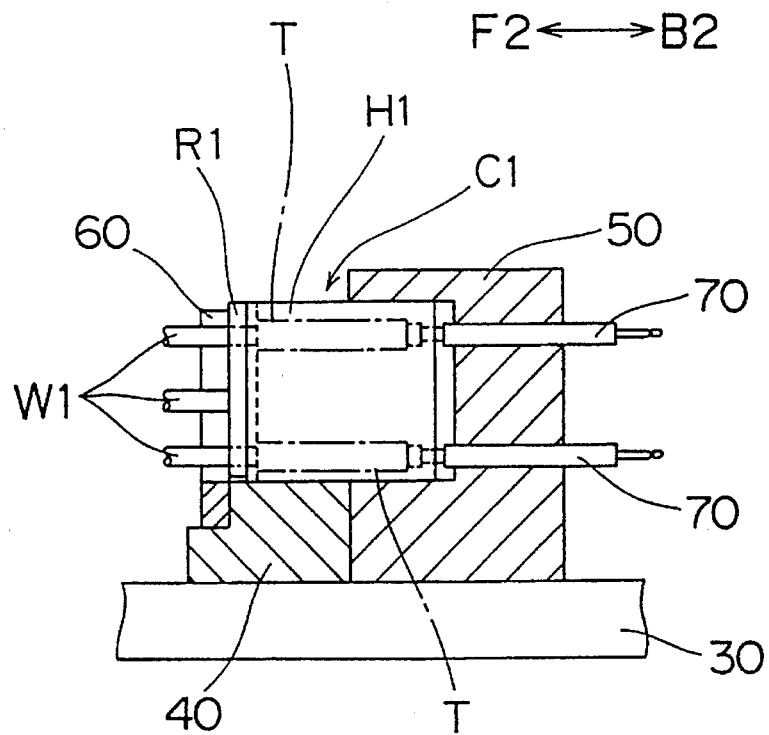
FIG. 5 is a schematic view illustrating the inspection of a connector with a retainer mounted on the housing.

At this time, when the retainer R1 has been mounted on the housing H1 as shown in FIG. 5, the retainer R1 comes in contact with the size regulating member 60 to regulate the movement of the connector C1, thus positioning the housing H1 within the receiving portion 40. Accordingly, with reception of the operating force of the lever 80, the detecting pieces 70 are pressed against the terminal metal fittings T in the housing H1. This causes the detecting pieces 70 and the terminal metal fittings T to be electrically connected to each other. More specifically, the terminal metal fittings T and the first probes 71 are electrically connected to each other by the contact pressure provided by the coiled springs 714, and the first probes 71 and the second probes 72 are electrically connected to each other by the contact pressure provided by the coiled springs 741. This achieves the inspection of the connector to make certain that the terminal metal fittings T have been mounted and that crimping the electric wires W1 on the terminal metal fittings T is good.

Figure 6:
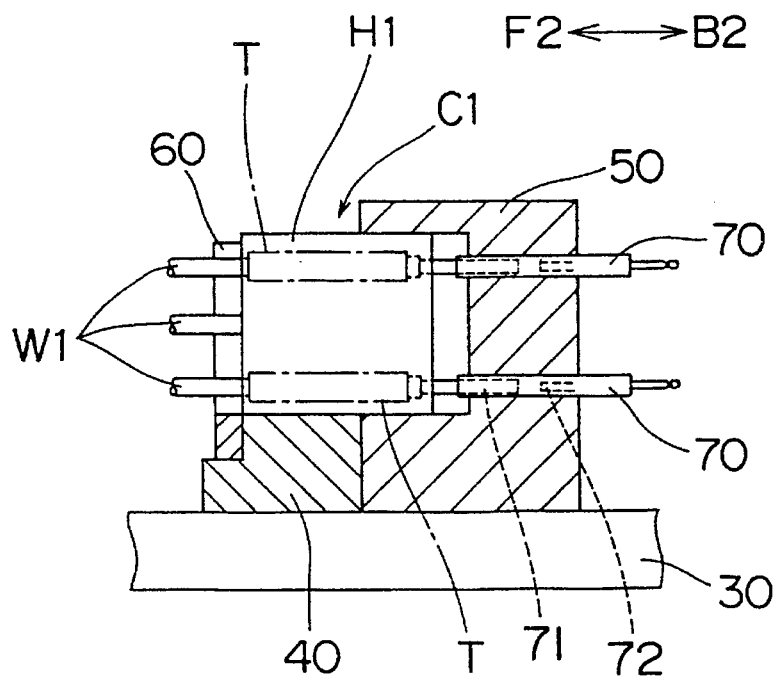
FIG. 6 is a schematic view illustrating the inspection without a retainer mounted on the housing.

On the other hand, when no retainer R1 has been mounted on the housing H1 as shown in FIG. 6, a slight gap is formed between the housing H1 and the size regulating member 60. Accordingly, by the pressing load of the detecting pieces 70 transmitted to the housing H1 from the terminal metal fittings T with reception of the operating force of the lever 80, the housing H1 is positionally shifted as pushed in the direction F2 until the end surface of the housing H1 comes in contact with the size regulating member 60. Accordingly, even though the detecting pieces 70 come in contact with the terminal metal fittings T in the housing H1, the stroke length of positional shift causes the coiled springs 714 not to be sufficiently bent. This prevents the first and second probes 71, 72 from coming in contact with each other, causing the detecting pieces 70 not to be electrically conducted. This indicates that no retainer R1 has not been mounted on the housing H1.

As discussed in the foregoing, the connector inspecting apparatus D1 of the first embodiment is arranged such that, at the time of conduction inspection, when the inspecting portion 50 is brought into contact with the receiving portion 40 provided on the front surface thereof with the size regulating member 60, the retainer R1 comes in contact with the size regulating member 60 to regulate the movement of the connector C1 so that the detecting pieces 70 come in contact with the terminal metal fittings T in the housing H1, indicating that the retainer R1 has duly been mounted, or the housing H1 is positionally shifted to prevent the detecting pieces 70 from being electrically conducted, indicating that the retainer R1 has not been mounted. More specifically, a conventional conduction inspecting mechanism is utilized, as it is, for checking a failure to mount a retainer. Accordingly, even though a function of checking a failure to mount a retainer is added to the inspecting apparatus, the apparatus is simple in structure and can be maintained in a compact design.

Figure 7:
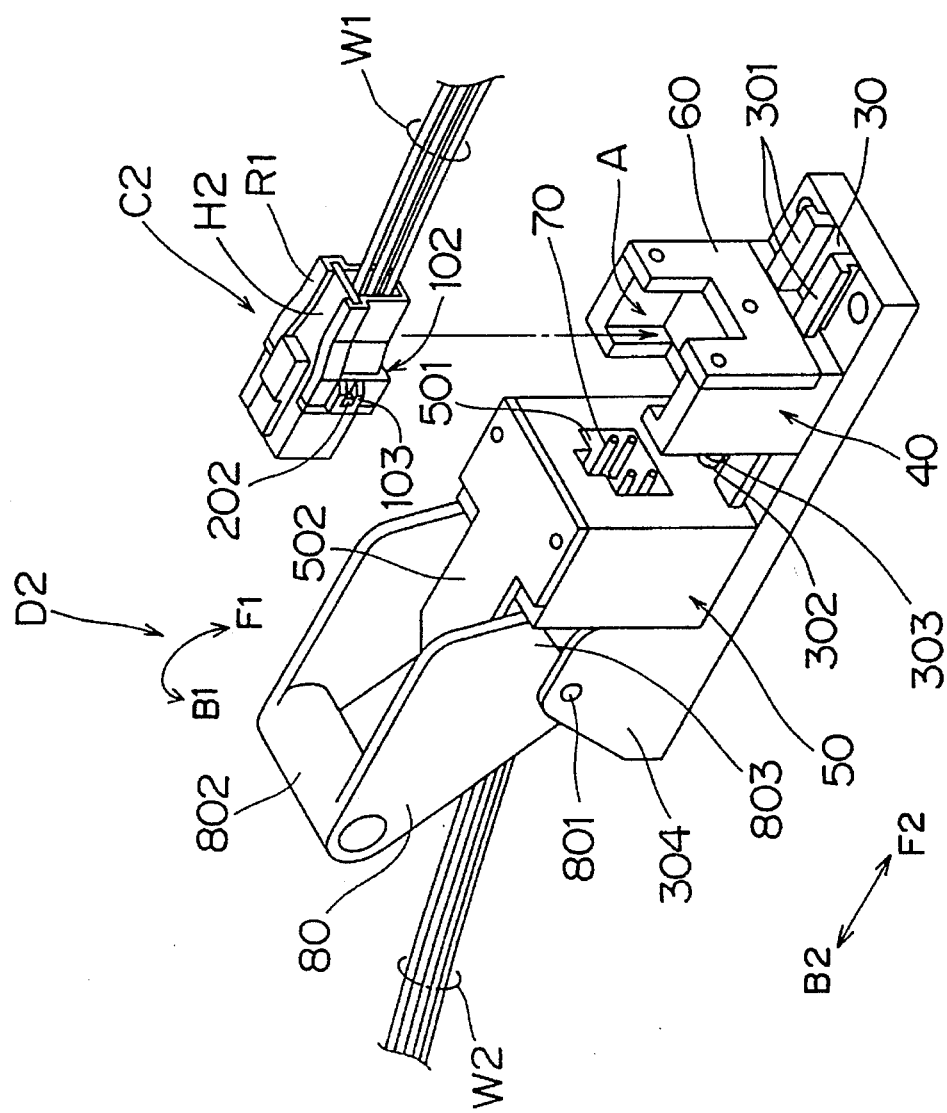
FIG. 7 is a perspective view illustrating the arrangement of a connector inspecting apparatus according to a second embodiment of the present invention.

The following description will discuss a second embodiment of the present invention with reference to FIG. 7.

FIG. 7 is a perspective view illustrating the arrangement of a connector inspecting apparatus D2 according to the second embodiment of the present invention. In FIG. 7, a connector C2 to be inspected by the connector inspecting apparatus D2 is arranged such that a retainer R2 having a substantially U-shape section is put on the outer periphery of a housing H2, and that an engaging piece 103 formed at a lateral wall shoulder portion 102 of the retainer R2, is engaged with a locking pawl 202 projecting from a lateral side of the housing H2.

Thus, the connector C2 inspecting apparatus D2 is characterized in that, at the time of inspection, the housing H2 is adapted to be positioned in the connector receiving portion 40 with the shoulder portion 102 of the retainer R2 brought into contact with the size regulating member 60. As to other arrangement, the connector inspecting apparatus D2 is similar to the apparatus of the first embodiment.

With the arrangement above-mentioned, the lever 80 is raised until it stands substantially vertically, such that the opposite end surface of the inspecting portion 50 and the connector receiving portion 40 come into contact with each other. At this time, when the retainer R2 has been mounted on the housing H2, the lateral wall shoulder portion 102 of the retainer R2 comes in contact with the size regulating member 60 to regulate the movement of the connector C2. This causes the detecting pieces 70 to come in contact with the terminal metal fittings T in the housing H2, thereby to electrically connect the detecting pieces 70 to the terminal metal fittings T.

On the other hand, if the retainer R2 has not been mounted on the housing H2, the housing H2 is positionally shifted likewise in the first embodiment, thereby to prevent the detecting pieces 70 from being electrically conducted.

Figure 8:
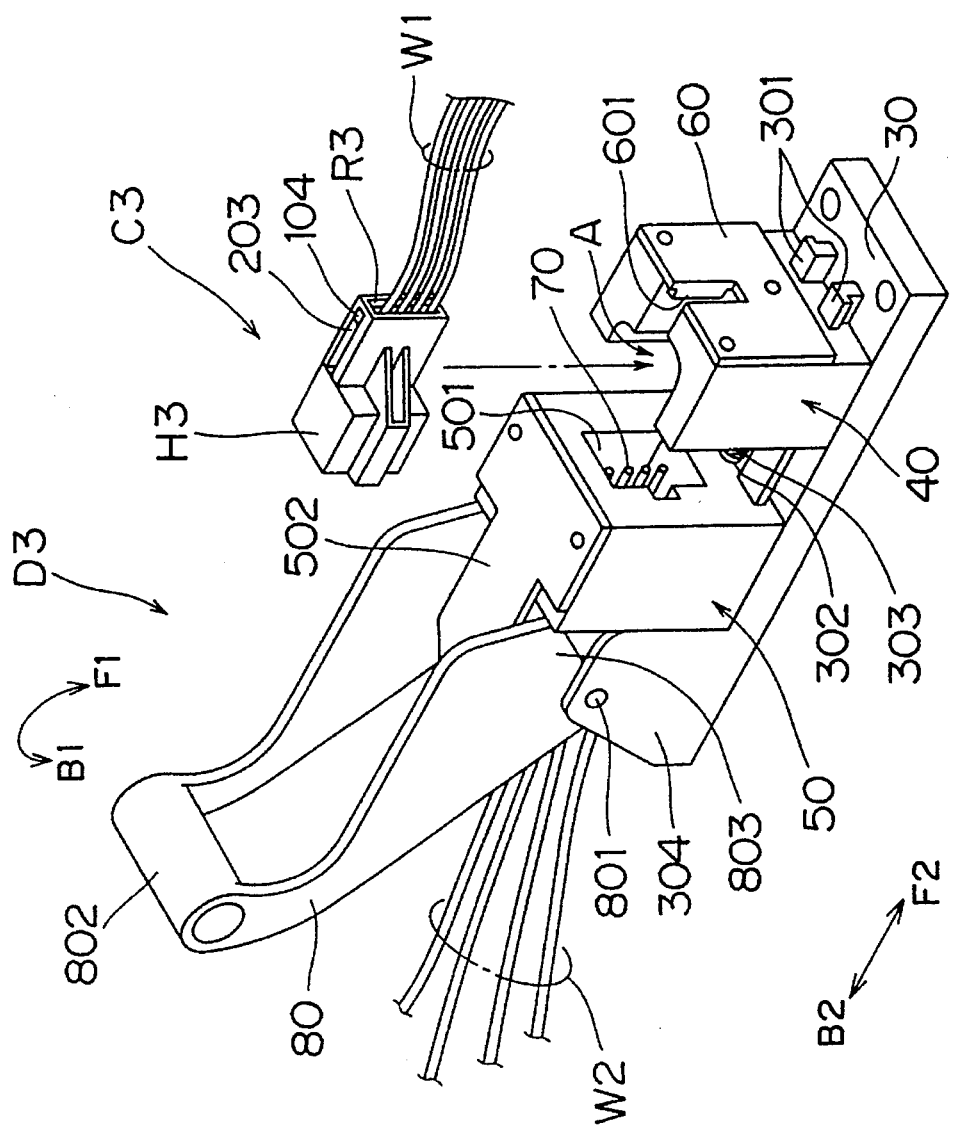
FIG. 8 is a perspective view illustrating the arrangement of a connector inspecting apparatus according to a third embodiment of the present invention.

The following description will discuss a third embodiment of the present invention with reference to FIG. 8.

FIG. 8 is a perspective view illustrating the arrangement of a connector inspecting apparatus D3 according to the third embodiment of the present invention. Referring to FIG. 8, a connector C3 to be inspected by the connector inspecting apparatus D3 is arranged such that a plate-like retainer R3 is perfectly inserted into the housing H3 and that a projection 104 formed at a lateral side of the retainer R3 (which is shown as turned up in FIG. 8) is engaged with an engagement hole 203 formed in a lateral side of the housing H3 (which is shown as turned up in FIG. 8).

Thus, the connector C3 inspecting apparatus D3 is characterized in that the size regulating member 60 is provided at notch edges thereof with convex portions 601 adapted to come in contact with the retainer R3. As to other arrangement, the connector inspecting apparatus D3 is similar to the apparatus of the first embodiment.

With the arrangement above-mentioned, the lever 80 is raised until it stands substantially vertically, such that the inspecting portion 50 is brought into contact with the connector receiving portion 40. At this time, when the retainer R3 has been mounted on the housing H3, the housing H3 is positioned in the receiving portion 40 with the retainer R3 coming in contact with the convex portions 601 of the size regulating member 60. This causes the detecting pieces 70 to be pressed against the terminal metal fittings T in the housing H3. This results in electrical connection between the detecting pieces 70 and the terminal metal fittings T.

On the other hand, if the retainer R3 has not been mounted on the housing H3, the housing H3 is positionally shifted in the direction F2 likewise in each of the first and second embodiments. Accordingly, the housing H3 is positioned in the receiving portion 40 with the end surface of the housing H3 coming in contact with the size regulating member 60. Therefore, the detecting pieces 70 are not electrically conducted likewise in each of the first and second embodiments. This indicates that the retainer R3 has not been mounted on the housing H3.

Figure 9:
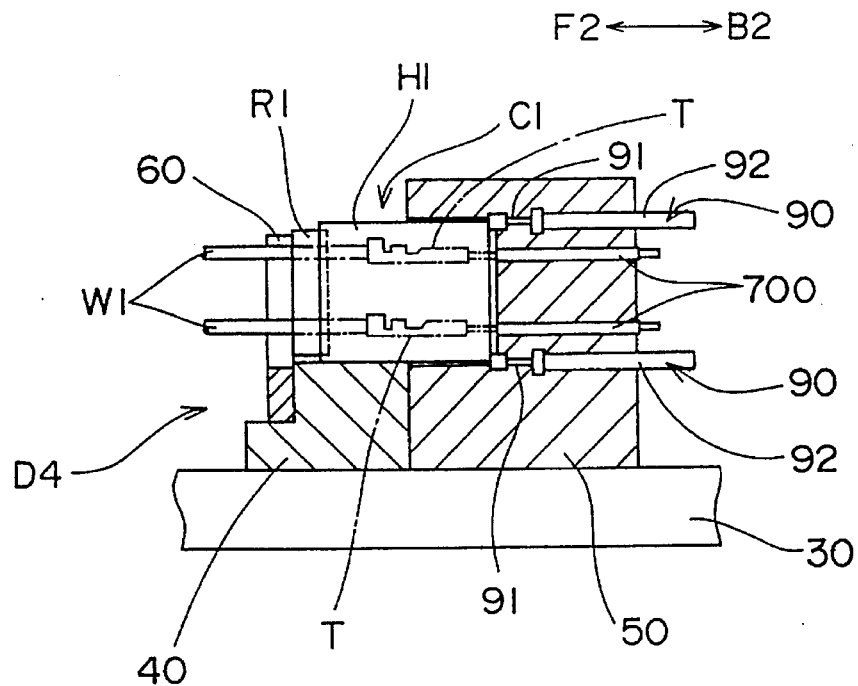
FIG. 9 is a section view, with portions enlarged, of a connector inspecting apparatus according to a fourth embodiment of the present invention, schematically illustrating the inspection of a connector with a retainer mounted on the housing.
Figure 10:
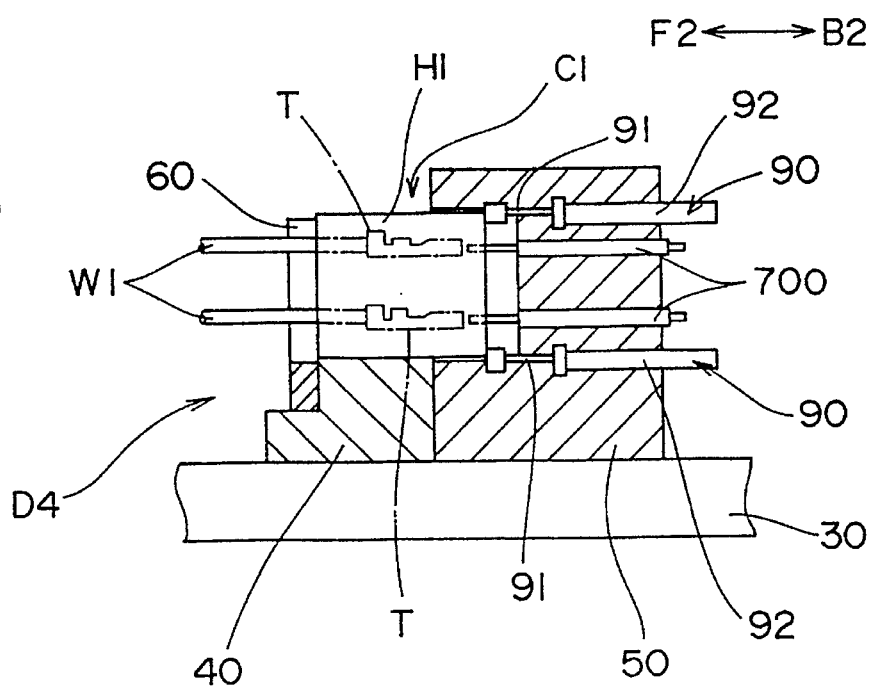
FIG. 10 is a section view, with portions enlarged, of the connector inspecting apparatus according to the fourth embodiment of the present invention, schematically illustrating the inspection without a retainer mounted on the housing.

The following description will discuss a fourth embodiment of the present invention with reference to FIGS. 9 and 10.

FIGS. 9 and 10 are section views, with portions enlarged, of a connector inspecting apparatus D4 according to the fourth embodiment of the present invention, schematically illustrating inspecting operations thereof. More specifically, FIG. 9 shows the state of inspection of a connector with a retainer mounted on the housing, while FIG. 10 shows the state of inspection of a connector without a retainer mounted on the housing.

Referring to FIGS. 9 and 10, the connector inspecting apparatus D4 is of the type corresponding to the connector C1 shown in FIG. 3, and is characterized in that the inspecting portion 50 has detecting pieces 700 adapted to be electrically connected to the terminal metal fittings T as brought into contact therewith, and pushing pieces 90 adapted to come in contact with and press the end surface of the housing H1. As to other arrangement, the connector inspecting apparatus D4 is similar to the apparatus of the first embodiment.

The detecting pieces 700 are of a so-called one-probe type. Heads of the detecting pieces 700 adapted to come in contact with terminal metal fittings T, are biased toward the receiving portion 40 in the forward direction F2, and are adapted to be electrically conducted when the heads come in contact with the terminal metal fittings T.

The pushing pieces 90 are disposed at upper and lower portions of the inspecting surface of the inspecting portion 50. The pushing pieces 90 are arranged such that probes 91 are fitted, from front, in sleeves 92 held by the inspecting portion 50 and that the probes 91 are resiliently biased toward the receiving portion 40 (in the direction F2) by coiled springs (not shown). In a state where no inspection is conducted, the tips of the probes 91 are located forward with respect to the tips of the detecting pieces 700. Accordingly, when conducting an inspection by bringing the inspecting portion 50 near to the receiving portion 40, the probes 91 come in contact with and press the end surface of the housing H1 before the detecting pieces 700 come in contact with the terminal metal fittings T.

With the arrangement above-mentioned, when the retainer R1 has been mounted on the housing H1 as shown in FIG. 9, the housing H1 is positioned in the receiving portion 40 with the retainer R1 coming in contact with the size regulating member 60. At the time of inspection, when the lever 80 is operated to bring the inspecting portion 50 near to the receiving portion 40, the probes 91 of the pushing pieces 90 first come in contact with the end surface of the housing H1. However, since the retainer R1 comes in contact with the size regulating member 60 to regulate the movement of the connector C1, the probes 91 enter the sleeves 92 with reception of the operating force of the lever 80. When the inspecting portion 50 comes in contact with the receiving portion 40, the detecting pieces 700 come in contact with the terminal metal fittings T in the housing H1. This results in electrical connection between the detecting pieces 700 and the terminal metal fittings T.

On the other hand, when the retainer R1 has not been mounted on the housing H1 as shown in FIG. 10, there is formed a slight gap between the housing H1 and the size regulating member 60. With reception of the operating force of the lever 80 applied at the time of inspection, the housing H1 is pushed and positionally shifted in the direction F2 by the probes 91 of the pushing pieces 90, so that the end surface of the housing H1 comes in contact with the size regulating member 60. In such a state, the housing H1 is positioned in the receiving portion 40. Accordingly, when the inspecting portion 50 comes in contact with the receiving portion 40, the detecting pieces 700 do not come in contact with the terminal metal fittings T in the housing H1. As a result, the detecting pieces 700 and the terminal metal fittings T cannot be electrically connected to each other. This indicates that the retainer R1 has not been mounted on the housing H1.

The present invention should not be limited to the specific embodiments above-mentioned, but a variety of modifications and changes thereof can be made without departing from the spirit or essential characteristics of the invention.

In the fourth embodiment for example, provision may be made such that the inner configuration of the receiving portion 40 and/or the configuration of the size regulating member 60 are so changed as to correspond to each of the connectors C2, C3 shown in FIGS. 7, 8. In such a case, the arrangement according to the fourth embodiment can also inspect each of the connectors C2, C3 to make certain that each of the retainers R2, R3 has been mounted.

The specific embodiments above-mentioned are therefore to be considered in all respects as illustrative for clarifying the technical contents of the present invention, and the present invention is not to be construed in a restricted sense as limited to these specific embodiments. Thus, the spirit and scope of the present invention are limited only by the appended claims.

What is claimed is:

1. A connector inspecting apparatus for inspecting a connector having a retainer which fixes, in an assistant manner, terminal metal fittings mounted on a housing at predetermined positions thereof, comprising:

an inspecting portion having detecting pieces which are disposed as corresponding to the terminal metal fittings to be inspected and which are adapted to be electrically connected to the terminal metal fittings when the detecting pieces are brought into contact therewith by a predetermined contact pressure;

a receiving portion adapted to receive the housing such that the terminal metal fittings are opposite to the detecting pieces and such that the housing is movable toward and away from the detecting pieces;

means for moving the inspecting portion to a predetermined position in close proximity to the connector held in the receiving portion and also for returning the inspecting portion from the proximate position to the original position; and a size regulating member integrally formed at the receiving portion for positioning, through the retainer of the connector, the housing with respect to the inspecting portion located in the proximate position.

2. A connector inspecting apparatus according to claim 1, wherein the detecting pieces comprise:

first probes adapted to come in contact with the terminal metal fittings of the connector;

second probes connected in series to the first probes with gaps provided therebetween; and biasing members for biasing the first probes toward the terminal metal fittings, the biasing members being so set as to be compressed to allow the first and second probes to be short-circuited to each other when the first probes are brought into contact with the terminal metal fittings of a connector having a retainer mounted thereon, and as to press the connector against the size regulating member with the gaps maintained when the first probes are brought into contact with the terminal metal fittings of a connector having no retainer mounted thereon.

3. A connector inspecting apparatus according to claim 2, wherein the size regulating member is screwed to the connector receiving portion and is a metallic plate member having a substantially U-shape section which includes a through-passage portion through which electric wires connected to the connector pass.

4. A connector inspecting apparatus according to claim 2, wherein the retainer of the connector is mounted on the housing along the inspecting portion moving direction.

5. A connector inspecting apparatus according to claim 1, wherein the size regulating member is screwed to the connector receiving portion and is a metallic plate member having a substantially U-shape section which includes a through-passage portion through which electric wires connected to the connector pass.

6. A connector inspecting apparatus according to claim 1, wherein the retainer of the connector is mounted on the housing along the inspecting portion moving direction.

7. A connector inspecting apparatus for inspecting a connector having a retainer which fixes, in an assistant manner, terminal metal fittings mounted on a housing at predetermined positions thereof, comprising:

an inspecting portion having detecting pieces which are disposed as corresponding to the terminal metal fittings of a connector to be inspected and which project toward a receiving portion such that the detecting pieces are adapted to come in contact with and electrically connect to the terminal metal fittings, and pushing pieces projecting and biased toward the receiving portion such that the pushing pieces are adapted to come in contact with and push the end surface of the housing before the detecting pieces come in contact with the terminal metal fittings;

the receiving portion adapted to receive the housing such that the terminal metal fittings are opposite to the detecting pieces and such that the housing is movable toward and away from the detecting pieces;

means for moving the inspecting portion to a predetermined position in close proximity to the connector held in the receiving portion and also for returning the inspecting portion from the proximate position to the original position; and a size regulating member integrally formed at the receiving portion for positioning, through the retainer of the connector, the housing with respect to the inspecting portion located in the proximate position.

8. A connector inspecting apparatus according to claim 7, wherein the detecting pieces are probes capable of detecting that the detecting pieces are electrically conducted when brought into contact with the terminal metal fittings.

* * * * *